(12) United States Patent
Melde et al.

(10) Patent No.: US 11,631,772 B2
(45) Date of Patent: Apr. 18, 2023

(54) NON-VOLATILE MEMORY STRUCTURE USING SEMICONDUCTOR LAYER AS FLOATING GATE AND BULK SEMICONDUCTOR SUBSTRATE AS CHANNEL REGION

(71) Applicant: GLOBALFOUNDRIES U.S. Inc., Santa Clara, CA (US)

(72) Inventors: Thomas Melde, Dresden (DE); Stefan Dünkel, Dresden (DE); Ralf Richter, Dresden (DE)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/147,684

(22) Filed: Jan. 13, 2021

(65) Prior Publication Data
US 2022/0223740 A1 Jul. 14, 2022

(51) Int. Cl.
H01L 27/11521 (2017.01)
H01L 29/788 (2006.01)
H01L 29/423 (2006.01)
H01L 27/12 (2006.01)

(52) U.S. Cl.
CPC .... H01L 29/7883 (2013.01); H01L 27/11521 (2013.01); H01L 27/1203 (2013.01); H01L 29/42328 (2013.01)

(58) Field of Classification Search
CPC .......... H01L 29/7883; H01L 27/11521; H01L 27/1203; H01L 29/42328; H01L 27/11563; H01L 29/66825; H01L 27/11524
See application file for complete search history.

(56) References Cited

U.S. PATENT DOCUMENTS

| | | | |
|---|---|---|---|
| 9,754,951 B2 | 9/2017 | Richter et al. | |
| 9,922,986 B2 | 3/2018 | Richter et al. | |
| 10,878,915 B1* | 12/2020 | Chang | G11C 16/08 |
| 2005/0127428 A1* | 6/2005 | Mokhlesi | H01L 27/11521 |
| | | | 257/E21.422 |
| 2015/0035040 A1 | 2/2015 | Yoo et al. | |
| 2017/0345834 A1 | 11/2017 | Melde | |
| 2018/0012898 A1* | 1/2018 | Wu | H01L 29/42328 |

OTHER PUBLICATIONS

"Floating Gate Memory Cell and Memory Array Structure", U.S. Appl. No. 16/743,070, filed Jan. 15, 2020.

* cited by examiner

*Primary Examiner* — Selim U Ahmed
(74) *Attorney, Agent, or Firm* — Yee Tze Lim; Hoffman Warnick LLC

(57) ABSTRACT

A non-volatile memory (NVM) structure includes a first memory device including: a first inter-poly dielectric defined by an isolation layer over a first semiconductor layer over an insulator layer (SOI) stack over a bulk semiconductor substrate, a first tunneling insulator defined by the insulator layer, a first floating gate defined by the semiconductor layer of the SOI stack, and a first channel region defined in the bulk semiconductor substrate between a source region and a drain region. The memory device may also include a control gate over the SOI stack, an erase gate over a source region in the bulk substrate, and a bitline contact coupled to a drain region in the bulk substrate. The NVM structure may also include another memory device similar to the first memory device and sharing the source region.

19 Claims, 3 Drawing Sheets

NON-VOLATILE MEMORY STRUCTURE USING SEMICONDUCTOR LAYER AS FLOATING GATE AND BULK SEMICONDUCTOR SUBSTRATE AS CHANNEL REGION

BACKGROUND

The present disclosure relates to memory devices, and more specifically, to non-volatile memory structures using a semiconductor layer over an insulator layer as a floating gate, and bulk semiconductor substrate as a channel region.

Non-volatile memory (NVM) structures are computer storage devices that can be erased and re-programmed. NVM structures are commonly used in mobile devices, personal computers, servers, automobiles, digital cameras, and other electronic devices. NVM structures in the form of flash memory cells resemble standard floating-gate metal-oxide semiconductor field-effect transistors (MOSFETs), except the gate includes two parts. The current flows into the source and drain regions, and is controlled by the floating gate (FG) and a control gate (CG) thereover. The FG is surrounded by a first insulator, referred to as the tunnel insulator, and a second isolating layer, called an inter-poly dielectric (IPD). Electrons placed in the FG are trapped and are isolated. The trapped electrons increase the threshold voltage of the cell such that a higher voltage must be applied to the CG to turn the switch on, making the channel conductive. When an intermediate voltage between the normal threshold voltage and the higher threshold voltage is applied to the CG, a value can be read from the transistor. If the channel conducts at the intermediate voltage because the FG is not charged, a logical "1" is indicated in the FG. In contrast, if the channel does not conduct at the intermediate voltage, a logical "0" is indicated in the FG. Hence, a logical "1" or "0" is identified based on whether current flows in the transistor when the intermediate voltage is applied to the CG. An additional electrode placed above the source region can have a voltage applied thereto to remove the electrons, thus acting as an erase gate (EG).

Semiconductor-on-insulator (SOI) substrates have been used to form NVM structures, using the semiconductor layer as the control gate or the floating gate. However, the processes that are necessary to fabricate such structures present a number of challenges. For example, the processing requires a number of polysilicon depositions to form the various gates in different lateral and vertical positions. As a result, the processing requires the gate stacks to be separately formed in different regions with trench isolations therebetween. The formation of some of the gates, e.g., select gates, over other structure may also create height difference issues for other processing. The processing also requires specific formation steps for an IPD between the control gate and the floating gate.

SUMMARY

An aspect of the disclosure is directed to a non-volatile memory (NVM) structure, comprising: a first memory device, including: a first inter-poly dielectric defined by an isolation layer over a first semiconductor layer over a first insulator layer (first SOI) stack over a bulk semiconductor substrate, a first tunneling insulator defined by the first insulator layer, a first floating gate defined by the semiconductor layer of the first SOI stack, and a first channel region defined in the bulk semiconductor substrate between a source region and a first drain region.

Another aspect of the disclosure includes a non-volatile memory (NVM) structure, comprising: a first memory device, including: a first inter-poly dielectric defined by an isolation layer over a first semiconductor layer over a first insulator layer (first SOI) stack over a bulk semiconductor substrate, a first tunneling insulator defined by the first insulator layer of the first SOI stack, a first control gate over the isolation layer over the first SOI stack, a first floating gate defined by the first semiconductor layer of the first SOI stack, an erase gate over the isolation layer over a source region in the bulk semiconductor substrate, and a first bitline contact coupled to a first drain region in the bulk semiconductor substrate, the first drain region separated from the source region by a first channel region in the bulk semiconductor substrate; and a second memory device, including: a second inter-poly dielectric defined by the isolation layer over a second semiconductor layer over a second insulator layer (second SOI) stack over the bulk semiconductor substrate, the first and second SOI stacks being electrically isolated from one another, a second tunneling insulator defined by the second insulator layer of the second SOI stack, a second control gate over the isolation layer over the second SOI stack, a second floating gate defined by the second semiconductor layer of the second SOI stack, and a second bitline contact coupled to a second drain region in the bulk semiconductor substrate, the second drain region separated from the source region by a second channel region in the bulk semiconductor substrate.

An aspect of the disclosure related a non-volatile memory (NVM) structure, comprising: a first memory device, including: a first inter-poly dielectric defined by an isolation layer over a first semiconductor layer over a first insulator layer (first SOI) stack over a bulk semiconductor substrate, a first tunneling insulator defined by the first insulator layer, a first floating gate defined by the first semiconductor layer of the first SOI stack, and a first channel region defined in the bulk semiconductor substrate between a source region and a first drain region; and a second memory device, including: a second inter-poly dielectric defined by the isolation layer over a second semiconductor layer over a second insulator layer (second SOI) stack over the bulk semiconductor substrate, the first and second SOI stacks being electrically isolated from one another, a second tunneling insulator defined by the second insulator layer of the second SOI stack, a second control gate over the isolation layer over the second SOI stack, a second floating gate defined by the second semiconductor layer of the second SOI stack, and a second channel region defined in the bulk semiconductor substrate between the source region and a second drain region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
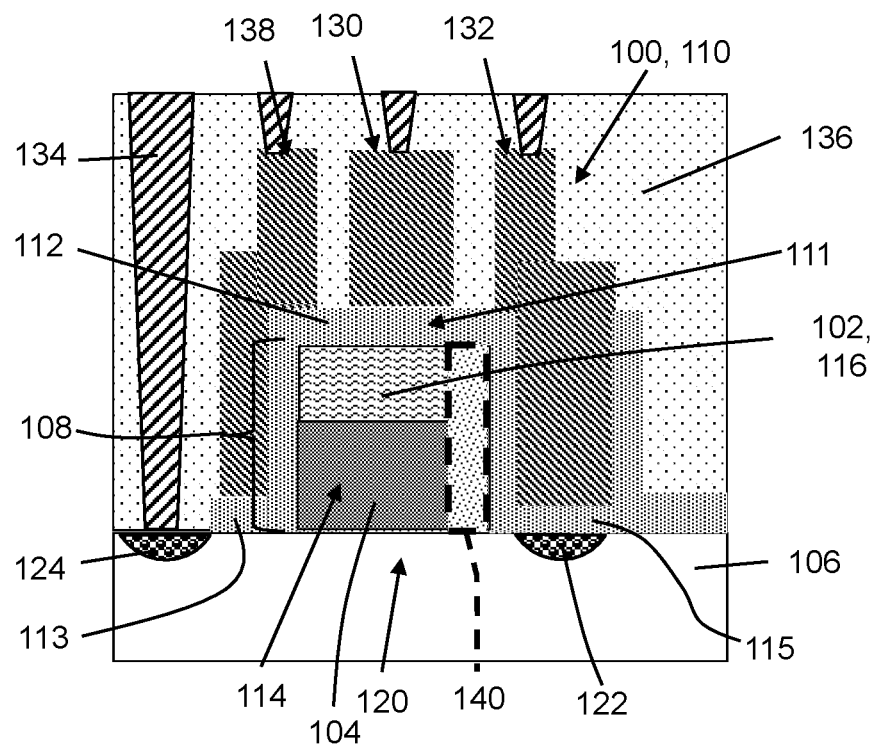
FIG. 1 shows a cross-sectional view of a non-volatile memory (NVM) structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a non-volatile memory (NVM) structure. The NVM structure includes a semiconductor layer over an insulator layer (semiconductor-on-insulator (SOI)) stack over a bulk substrate. A first memory device of the NVM structure includes: an isolation layer over the SOI stack forming a tunneling insulator with the insulator layer, a floating gate defined by the semiconductor layer of the SOI stack, and a channel region defined in the bulk semiconductor substrate between a source region and a drain region. The first memory device may also include a control gate over the SOI stack, an erase gate over the source region in the bulk substrate, and a bitline contact coupled to the drain region in the bulk substrate.

The NVM structure may also include a second memory device similar to the first memory device and sharing the source and erase gate region. Here, the NVM structure may also include: the isolation layer over another SOI stack forming another tunneling insulator with another insulator layer, another floating gate defined by the semiconductor layer of the other SOI stack, and another channel region defined in the bulk semiconductor substrate between the source region and another drain region. The gates of the structure can all be fabricated at the same time so they share at least one material layer, e.g., polysilicon or any of a number of metal gate layers. The gates can be formed with the same deposition and patterning processes, which allows the gate stacks to be separately formed in different regions without trench isolations therebetween. The floating gate being defined by the SOI layer and the insulator layer and forming at least part of the tunnel insulator simplifies the process of forming the floating gate and enclosing it in an insulator.

FIG. 1 shows a cross-sectional view of an NVM structure 100, according to embodiments of the disclosure. NVM structure 100 may include a stack 108 having a semiconductor layer over an insulator layer. In one example, semiconductor layer 102 may be a semiconductor-on-insulator layer, and insulator layer 104 may be a buried insulator layer, i.e., forming semiconductor-on-insulator (SOI) layers. Insulator layer 104 is over a bulk semiconductor substrate 106. Collectively, semiconductor layer 102 and insulator layer 104 are patterned to form stack 108 (hereinafter "SOI stack 108") over bulk semiconductor substrate 106. Semiconductor layer 102, insulator layer 104 and bulk semiconductor substrate 106 may be formed, for example, as any now known or later developed SOI substrate. Semiconductor layer 102 and bulk semiconductor substrate 106 may include but are not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). A portion of or the entire semiconductor substrate may be strained. Insulator layer 104 may include any appropriate dielectric such as but not limited to silicon dioxide. The precise thickness of insulator layer 104 and semiconductor layer 102 may vary widely with the intended application.

FIG. 1 shows NVM structure 100 including only a single, first memory device 110, according to one embodiment of the disclosure. As will be described herein, in alternative embodiments, an NVM structure may also include a second memory device. The memory device(s) may be implemented as, for example, any form of flash memory. Memory device 110 includes an isolation layer 112 providing an inter-poly dielectric (IPD) over an SOI stack 108, with insulator layer 104 providing a tunneling insulator 114. Isolation layer 112 may surround sidewalls and an upper surface of SOI stack 108. Isolation layer 112 may be part of a gate dielectric layer for gates 130, 132, 138, among other gates, or it may be a separate isolation layer. Isolation layer 112 may include any now known or later developed dielectric layer appropriate for providing an inter-poly dielectric. For example, isolation layer 112 may include: gate oxides like $SiO_2$, nitride $SiO_2$, silicon oxy-nitride (SiON), and any high dielectric constant (high-K) material, and combinations thereof. Insulator layer 104 provides a tunneling insulator 114.

Memory device 110 may also include a floating gate 116 defined by semiconductor layer 102 of SOI stack 108. That is, semiconductor layer 102 provides floating gate 116 for memory device 110. Memory device 110 also includes a channel region 120 defined in bulk semiconductor substrate 106 between a source region 122 and a drain region 124. Drain region 124 is separated from source region 122 by channel region 120 in bulk semiconductor substrate 106. Source/drain regions 122, 124 may be formed using any now known or later developed techniques, and may include any appropriate dopants. It is recognized that source region 122 and/or drain region 124 may extend into and out of the page for use by a number of memory devices in an array of memory devices.

Memory device 110 also may include a control gate 130 over isolation layer 112 over SOI stack 108, an erase gate 132 over isolation layer 112 over source region 122 in bulk semiconductor substrate 106, and a bitline contact 134 coupled to drain region 124 in bulk semiconductor substrate 106. Bitline contact 134 may be formed using any now known or later developed processing. In one non-limiting example, contact 134 may be formed by patterning a mask over an interlayer dielectric (ILD) 136 over memory device 110, etching a contact opening to the respective drain region 124, and forming a conductor in the openings. The conductor may include refractory metal liner, and a contact metal. The refractory metal liner (not labeled for clarity) may include, for example, ruthenium (Ru), tantalum (Ta), titanium (Ti), tungsten (W), iridium (Ir), rhodium (Rh) and platinum (Pt), etc., or mixtures of thereof. The contact metal may be any now known or later developed contact metal such as but not limited to copper (Cu) or tungsten (W). Similar contacts (not shown) can be formed to the various gates, described herein.

Erase gate 132 has an isolation layer 115 between it and source region 122, and is opposite select gate 138. In this case, isolation layer 115 may be the same as isolation layer 112 over floating gate 116, but this is not necessary in all instances.

As recognized in the art, NVM structure 100 may also be part of an array of similarly structured memory devices. In this case, NVM structure 100 may also include a select gate 138 adjacent SOI stack 108, allowing selection of which memory devices 110 in the array will operate collectively in a known fashion. An isolation layer 113 is between select gate 138 and drain region 124, and is opposite erase gate 132. In this case, isolation layer 113 may be the same as isolation layer 112 over floating gate 116, but this is not necessary in all instances.

In certain embodiments, memory device 110 may also include a spacer 140 (shown in dashed lines) adjacent SOI stack 108, i.e., under isolation layer 112. Spacer 140 may include any now known or later developed spacer material such as but not limited to silicon nitride. Spacer 140 may be used to adjust a position of the edge of erase gate 132 due to patterning limitations (minimum distance of etch edge to vertical gate pattern) away from floating gate 116. Such limitations may be required for device functionality reasons. A spacer 140 can be used on the other side of floating gate 116 (same as other side or alternatively thereto) next to select gate 138, e.g., to reduce disturbing interactions between select gate 138 and floating gate 116.

As illustrated in FIG. 1, gates 130, 132, 138 may be formed in the same layer. That is, control gate 130, erase gate 132 and select gate 138 share at least one material layer. Where polysilicon is used to form gates in the integrated circuit, gates 130, 132, 138 may include polysilicon. Alternatively, where gates used in the integrated circuit include metal gates, the gates may include any or all metal gate layers. Metal gates may include one or more conductive components for providing a gate terminal of a transistor. For example, metal gates may include a high dielectric constant (high-K) layer, a work function metal layer and a gate conductor (not all shown for clarity). The high-K layer may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap (not shown) of, for example, a nitride may also be formed over the gate region. Because all of the gates are formed in the same layer, fabrication is greatly simplified and the issues relating to certain gates having different heights, and the impact on processing in other areas of the integrated circuit, are eliminated.

Figure 2:
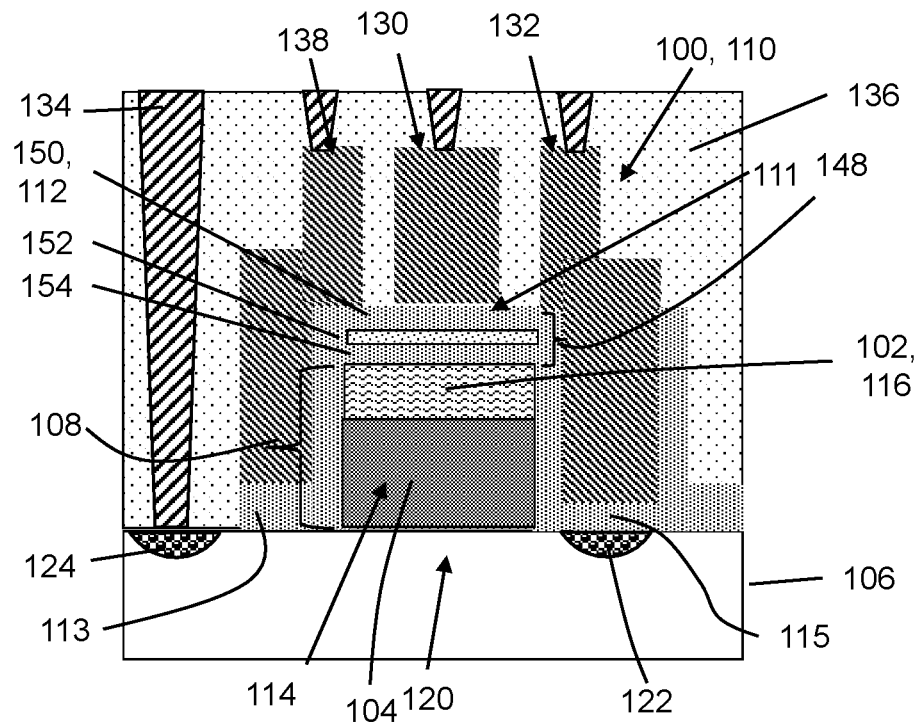
FIG. 2 shows a cross-sectional view of an NVM structure, according to optional embodiments of the disclosure.
Figure 3:
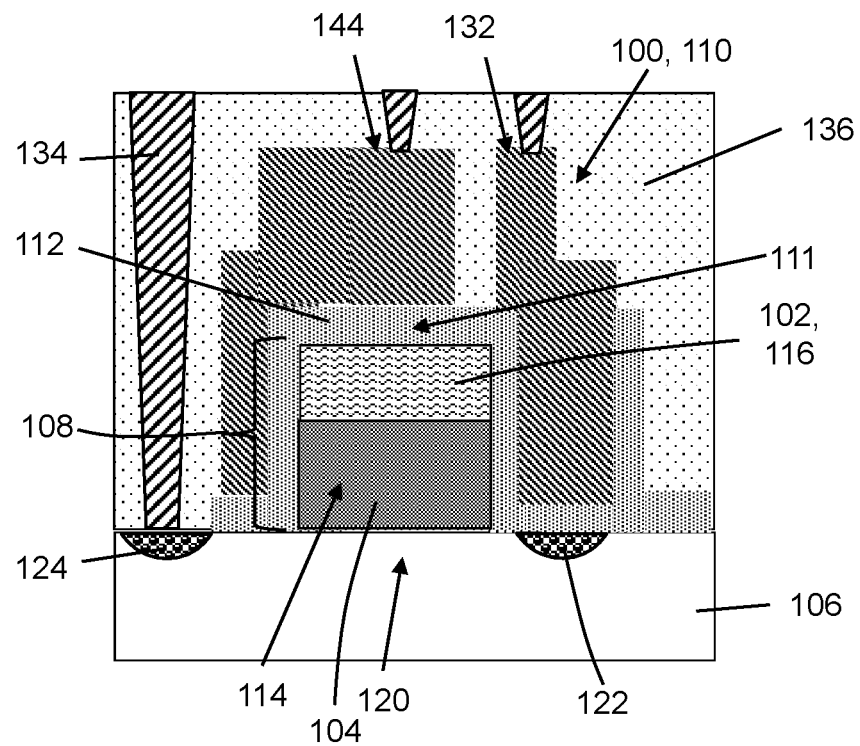
FIG. 3 shows a cross-sectional view of an NVM structure, according to other optional embodiments of the disclosure.

FIGS. 2-3 show cross-sectional views of NVM structure 100 and memory device 110, according to a number of optional embodiments. FIG. 2 shows a cross-sectional view of NVM structure 100 and memory device 110 including an oxide-nitride-oxide (ONO) layer 148 between control gate 130 and SOI stack 108. ONO layer 148 may include, for example, a silicon oxide layer 150 over a silicon nitride layer 152 over a silicon oxide layer 154. Layers 150, 154 may include the same material as isolation layer 112. ONO layer 148 may be used, for example, to control the threshold voltage of memory device 110. In another embodiment, silicon nitride layer 152, silicon oxide layer 154 and then isolation layer 112 can be formed, and might be shared with isolation layers 113, 115. FIG. 3 shows a cross-sectional view of NVM structure 100 and memory device 110 in which portions of the control gate and the select gate are merged, forming a single select-control gate 144. Select-control gate 144 may be used to control operation of memory device 110 where separate gates are not necessary for control and selection.

Figure 4:
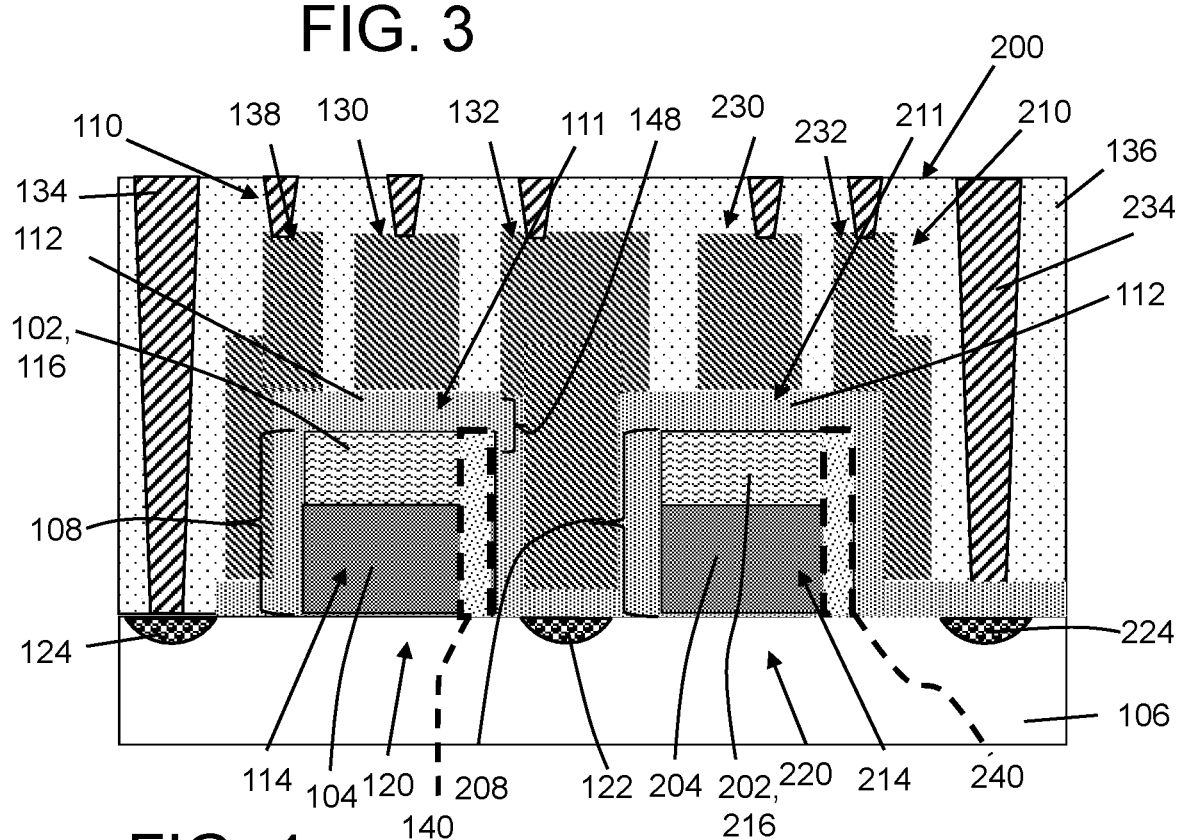
FIG. 4 shows a cross-sectional view of an NVM structure including two memory devices, according to embodiments of the disclosure.
Figure 5:
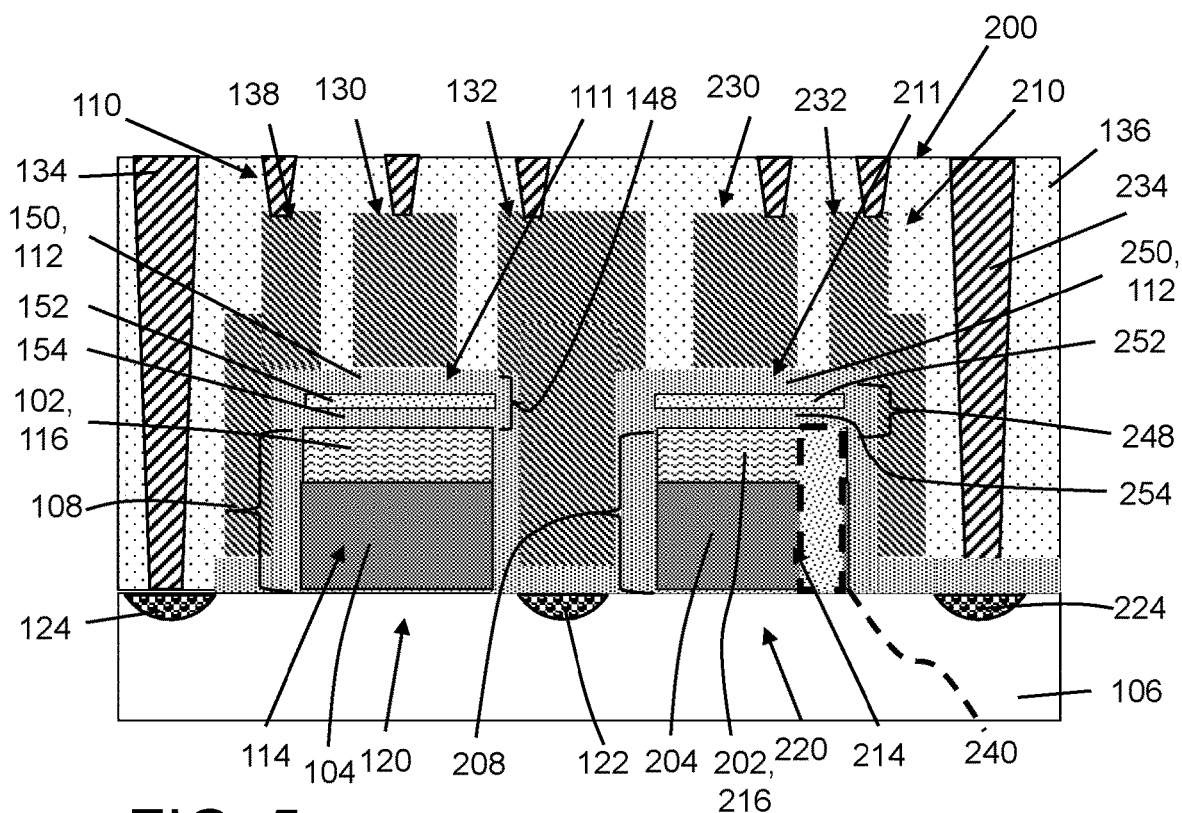
FIG. 5 shows a cross-sectional view of an NVM structure including two memory devices with merged select and control gates, according to optional embodiments of the disclosure.
Figure 6:
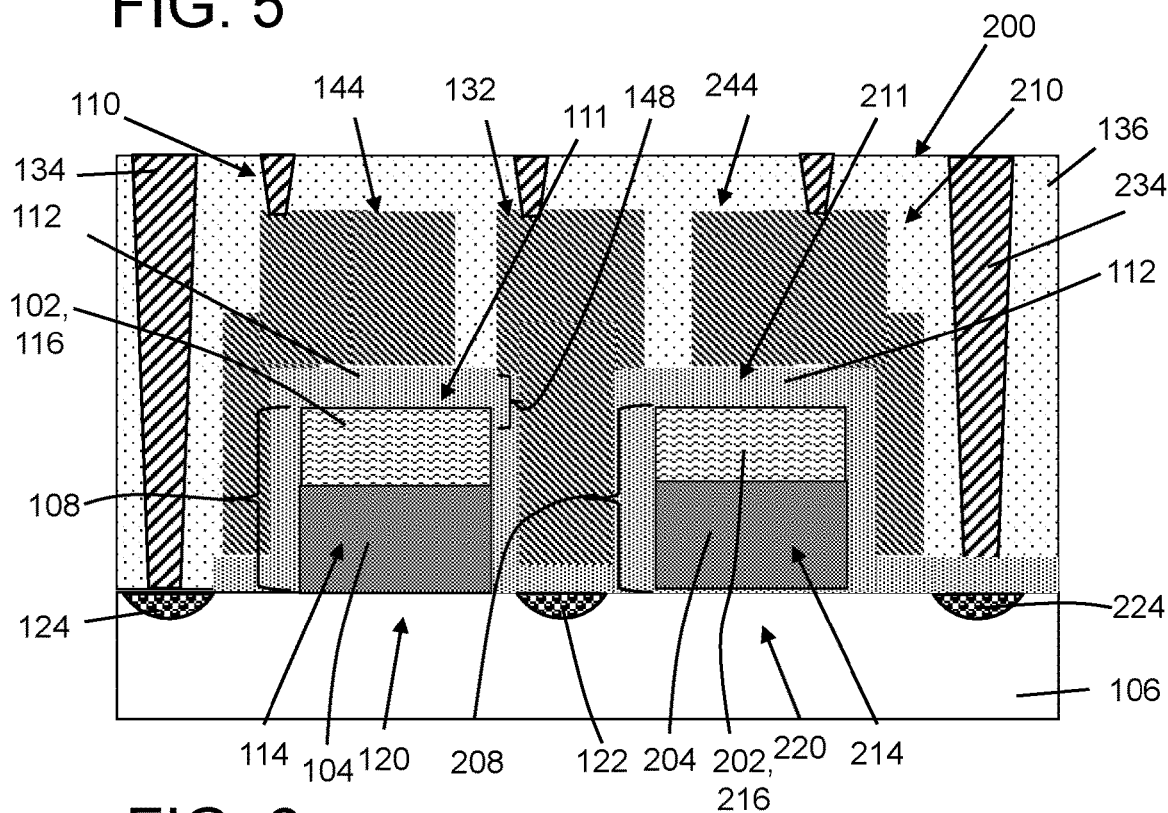
FIG. 6 shows a cross-sectional view of an NVM structure including two memory devices, according to additional optional embodiments of the disclosure.

FIGS. 4-6 show cross-sectional views of an NVM structure 200, according to embodiments of the disclosure. In FIGS. 4-6, two memory devices 110, 210 are used together, and share source region 122. NVM structure 200 is similar to split-gate flash memory arrays, such as ESF3 available from Silicon Storage Technology (SST).

NVM structure 200 includes first memory device 110, as described herein. That is, NVM structure 200 includes isolation layer 112 over first SOI stack 108 forming a first inter-poly dielectric 111, and a first tunneling insulator 114 defined by insulator layer 104. Isolation layer 112 may be part of a gate dielectric layer for gates 130, 132, 138, 230, 232, among other gates, or it may be a separate isolation layer. Memory device 110 may also include first floating gate 116 defined by semiconductor layer 102 of first SOI stack 108. Memory device 110 also includes and first channel region 120 defined in bulk semiconductor substrate 106 between source region 122 and first drain region 124. First drain region 124 is separated from source region 122 by first channel region 120 in bulk semiconductor substrate 106. Memory device 110 also may include first control gate 130 over isolation layer 112 over first SOI stack 108, first erase gate 132 over isolation layer 112 over source region 122 in bulk semiconductor substrate 106, and first bitline contact 134 coupled to drain region 124 in bulk semiconductor substrate 106. A first select gate 138 is adjacent first SOI stack 108, allowing selection of which memory devices 110 in the array will operate collectively.

NVM structure 200 also includes a second semiconductor layer 202 over a second insulator layer 204. Second insulator layer 204 is over bulk semiconductor substrate 106. Collectively, second semiconductor layer 202 and second insulator layer 204 are patterned to form a second SOI stack 208 over bulk semiconductor substrate 106. Semiconductor layer 202, insulator layer 204 and bulk semiconductor substrate 206 may be formed as any now known or later developed SOI substrate. First and second SOI stacks 108, 208 are electrically isolated from one another, e.g., by isolation layer 112. Isolation layer 112 is also over second SOI stack 208 and bulk semiconductor substrate 106 under second SOI stack 208, providing a second inter-poly dielectric 211, and a second tunneling insulator 214 defined by second insulator layer 204 of second SOI stack 208.

NVM structure 200 also includes second memory device 210, including: a second floating gate 216 defined by semiconductor layer 202 of second SOI stack 208, and a second channel region 220 defined in bulk semiconductor substrate 106 between source region 122 and a second drain region 224. As with first memory device 110, second memory device 210 may include a second control gate 230 over second SOI stack 208, and a second bitline contact 234 coupled to second drain region 224 in bulk semiconductor substrate 106. Second memory device 210 shares erase gate 132 with first memory device 110. Second memory device 210 may also include a second select gate 232 adjacent second SOI stack 208.

All of the structure of second memory device 210 may be fabricated similarly and typically simultaneously with like structure of first memory device 110. Notably, first control gate 130, second control gate 230, shared erase gate 132, first select gate 138 and second select gate 232 share at least one material layer, as described herein. That is, all of the gates may be formed in the same layer, simplifying fabrication.

FIGS. 5-6 show cross-sectional views of NVM structure 200 and memory devices 110, 210, according to a number of optional embodiments. FIG. 5 shows a cross-sectional view of NVM structure 200 and memory devices 110, 210 with each device including an oxide-nitride-oxide (ONO) layer 148, 248 between respective control gates 130, 230 and respective SOI stacks 108, 208. ONO layer 148 over second SOI stack 208 may include, for example, a silicon oxide layer 250 over a silicon nitride layer 252 over a silicon oxide layer 254. Layers 250, 254 may include the same material as isolation layer 112. FIG. 6 shows a cross-sectional view of NVM structure 200 and memory devices 110, 210 in which portions of first and second control gates 130, 230 (FIG. 5) and first and second select gates 132, 232 (FIG. 5) are respectively merged, forming a single first select-control gate 144 and second select-control gate 244. First and second select-control gates 144, 244 may be used to control operation of memory device 110 where separate gates are not necessary for control and selection.

As shown in FIG. 4, each memory device 110, 210 may include a spacer 140, 240, respectively adjacent at least one of first SOI stack 108 and second SOI stack 208.

In operation, read and program current flows through bitline contact(s) 134, 234 below select gate(s) 138, 238 and below floating gate(s) 116, 226 into channel region(s) 120, 220, through buried source region 122, and then is collected by a sourceline contact (not shown—located into or out of page of cross-sections shown) coupled to buried source region 122. A select line may be coupled to select gate(s) 138, 238 for activating and deactivating memory devices 110, 210, respectively, to implement operations of NVM structure 100 or 200. Erase gate 132 has no function during read and program operations, and typically is kept at source-line voltage. Keeping all terminals at zero voltage and applying a high positive bias to the erase gate(s) is one option for erase operation of the memory cells.

Embodiments of the disclosure provide an NVM structure in which the gates can all be fabricated at the same time so they share at least one material layer, e.g., polysilicon or any of a number of metal gate layers. The gates can be formed in different regions without trench isolations therebetween. The floating gate being defined by the semiconductor layer and the tunneling insulator layer defining at least part of the tunnel insulator simplifies the process of forming the floating gate and enclosing it in an insulator. The resulting NVM structure has a relatively small size, and can be built with very few additional steps.

The NVM structure as described above may be formed as separate memory chips or used as part of integrated circuit chips. In any event, the chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip may then integrated with other chips, discrete circuit elements, and/or other signal processing devices as part of either (a) an intermediate product, such as a motherboard, or (b) an end product. The end product can be any product that includes memory chips and/or integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A non-volatile memory (NVM) structure, comprising:
    a first memory device, including:
        a first inter-poly dielectric defined by an isolation layer over a first semiconductor layer vertically stacked over a first insulator layer (first SOI) stack over a bulk semiconductor substrate,
        a first tunneling insulator defined by the first insulator layer,
        a first floating gate defined by the first semiconductor layer of the first SOI stack, wherein the first floating gate is vertically stacked over the first tunneling insulator,
        a first channel region defined in the bulk semiconductor substrate between a source region and a first drain region,
        a first control gate over the isolation layer and over the first SOI stack; and
        an erase gate over the isolation layer, and over the source region in the bulk semiconductor substrate.

2. The NVM structure of claim 1, further comprising a spacer adjacent the first SOI stack.

3. The NVM structure of claim 1, further comprising:
    a first bitline contact coupled to the first drain region in the bulk semiconductor substrate.

4. The NVM structure of claim 3, further comprising a first select gate adjacent the first SOI stack.

5. The NVM structure of claim 4, wherein the first control gate, the erase gate and the first select gate share at least one material layer.

6. The NVM structure of claim 4, wherein portions of the first control gate and the first select gate are merged, forming a single first select-control gate.

7. The NVM structure of claim 3, further comprising an oxide-nitride-oxide (ONO) layer between the first control gate and the first SOI stack.

8. The NVM structure of claim 3, further comprising:
    a second memory device, including:
        a second inter-poly dielectric defined by the isolation layer over a second semiconductor layer over a second insulator layer (second SOI) stack over the bulk semiconductor substrate, the first and second SOI stacks being electrically isolated from one another,
        a second tunneling insulator defined by the second insulator layer of the second SOI stack,
        a second floating gate defined by the second semiconductor layer of the second SOI stack, and
        a second channel region defined in the bulk semiconductor substrate between the source region and a second drain region.

9. The NVM structure of claim 8, further comprising:
    a second control gate over the second SOI stack, and
    a second bitline contact coupled to the second drain region in the bulk semiconductor substrate.

10. The NVM structure of claim 9, further comprising a first select gate adjacent the first SOI stack, and a second select gate adjacent the second SOI stack.

11. The NVM structure of claim 10, wherein the first control gate, the second control gate, the erase gate, the first select gate and the second select gate share at least one material layer.

12. The NVM structure of claim 10, wherein portions of the first control gate and the first select gate are merged, forming a single first select-control gate, and wherein portions of the second control gate and the second select gate are merged, forming a single second select-control gate.

13. The NVM structure of claim 9, further comprising an oxide-nitride-oxide (ONO) layer between the first control gate and the first SOI stack and between the second control gate and the second SOI stack.

14. The NVM structure of claim 8, further comprising a spacer adjacent at least one of the first SOI stack and the second SOI stack.

15. A non-volatile memory (NVM) structure, comprising:
    a first memory device, including:
        a first inter-poly dielectric defined by an isolation layer over a first semiconductor layer over a first insulator layer (first SOI) stack over a bulk semiconductor substrate,
        a first tunneling insulator defined by the first insulator layer of the first SOI stack,
        a first control gate over the isolation layer over the first SOI stack,
        a first floating gate defined by the first semiconductor layer of the first SOI stack,
        an erase gate over the isolation layer over a source region in the bulk semiconductor substrate, and a first bitline contact coupled to a first drain region in the bulk semiconductor substrate, the first drain region separated from the source region by a first channel region in the bulk semiconductor substrate; and a second memory device, including:

a second inter-poly dielectric defined by the isolation layer over a second semiconductor layer over a second insulator layer (second SOI) stack over the bulk semiconductor substrate, the first and second SOI stacks being electrically isolated from one another, a second tunneling insulator defined by the second insulator layer of the second SOI stack, a second control gate over the isolation layer over the second SOI stack, a second floating gate defined by the second semiconductor layer of the second SOI stack, and a second bitline contact coupled to a second drain region in the bulk semiconductor substrate, the second drain region separated from the source region by a second channel region in the bulk semiconductor substrate.

16. The NVM structure of claim 15, further comprising a first select gate adjacent the first SOI stack and a second select gate adjacent the second SOI stack, and wherein the first control gate, the second control gate, the erase gate, the first select gate and the second select gate include at least one shared material layer.

17. The NVM structure of claim 16, wherein portions of the first control gate and the first select gate are merged, forming a single first select-control gate, and wherein portions of the second control gate and the second select gate are merged, forming a single second select-control gate.

18. The NVM structure of claim 15, further comprising a spacer adjacent at least one of the first SOI stack and the second SOI stack.

19. The NVM structure of claim 15, further comprising an oxide-nitride-oxide (ONO) layer between the first control gate and the first SOI stack and between the second control gate and the second SOI stack.

* * * * *